United States Patent [19]

Stahlhofen

[11] 4,275,139

[45] Jun. 23, 1981

[54] LIGHT-SENSITIVE MIXTURE AND COPYING MATERIAL PRODUCED THEREFROM

[75] Inventor: Paul Stahlhofen, Wiesbaden, Fed. Rep. of Germany

[73] Assignee: Hoechst Aktiengesellschaft, Fed. Rep. of Germany

[21] Appl. No.: 90,144

[22] Filed: Nov. 1, 1979

[30] Foreign Application Priority Data

Nov. 4, 1978 [DE] Fed. Rep. of Germany ....... 2847878

[51] Int. Cl.$^3$ .......................... G03C 1/60; G03C 1/54
[52] U.S. Cl. .................................... 430/192; 430/189; 430/191; 430/165; 430/926
[58] Field of Search ................ 430/191, 192, 923, 926

[56] References Cited

U.S. PATENT DOCUMENTS

| | | |
|---|---|---|
| 3,567,453 | 3/1971 | Borden ................. 430/191 |
| 3,647,443 | 3/1972 | Rauner et al. ......... 430/192 |
| 3,661,582 | 5/1972 | Broyde ................. 430/191 |
| 3,969,118 | 7/1976 | Stahlhofen et al. . |
| 4,009,033 | 2/1977 | Bakos et al. .......... 430/191 |
| 4,105,450 | 8/1978 | Shinozaki et al. .... 430/193 |
| 4,115,128 | 9/1978 | Kita ..................... 430/192 |
| 4,123,279 | 10/1978 | Kobayashi ........... 430/193 |

FOREIGN PATENT DOCUMENTS

| | | |
|---|---|---|
| 2146167 | 3/1972 | Fed. Rep. of Germany . |
| 2547905 | 4/1977 | Fed. Rep. of Germany . |
| 1418019 | 10/1965 | France . |
| 276734 | 10/1970 | U.S.S.R. ............. 430/192 |
| 332413 | 4/1972 | U.S.S.R. ............. 430/192 |

OTHER PUBLICATIONS

Chemical Abstracts, vol. 87, 1977, #76400x, (Stahlhofen et al.).
Chemical Abstracts, vol. 77, 1972, #95380a.

*Primary Examiner*—Charles L. Bowers, Jr.
*Attorney, Agent, or Firm*—James E. Bryan

[57] ABSTRACT

A positive-working light-sensitive copying material, in particular for the preparation of planographic printing plates, is described, the light-sensitive layer of which contains an ester or amide of a o-naphthoquinone diazide-sulfonic or -carboxylic acid, an alkali-soluble, water-insoluble phenolic resin and a condensation product of a hydroxybenzophenone and formaldehyde. The material is distinguished by an increased light-sensitivity.

6 Claims, No Drawings excess quantity of ice water, while stirring, and worked up in the customary manner.

In the condensation, which proceeds largely analogously to the preparation of phenol/formaldehyde resins, polymerhomologous mixtures of polycondensation products are, as a rule, formed. When phenolic starting materials are used which contain only one position, capable of condensation, on the nucleus, i.e. only one unoccupied o-position or p-position relative to an OH group, the pure reaction products having two hydroxybenzophenone units linked by a methylene group are formed, as a rule.

The concentration of the hydroxybenzophenone condensation products in the light-sensitive mixture can vary within relatively wide limits. In general, it is between 4 and 20% by weight, preferably between 6 and 10% by weight, relative to the total solids contents of the mixture or the copying layer.

The preferred 1,2-naphthoquinone diazide compounds are the sulfonic acid derivatives, in particular the esters with aromatic hydroxyl compounds. In general, the sulfonic acid group is in the 4-position or 5-position of the naphthalene nucleus, and the 5-sulfonic acid derivatives are preferred. Suitable naphthoquinone diazides are known and described, for example, in German Pat. Nos. 938,233, 1,124,817, 1,109,521, 1,120,273, 1,114,705, and 1,543,721, and in the earlier German patent applications Nos. P 2,742,631 and P 2,828,037. The quantity of naphthoquinone diazide compounds in the mixture is, in general, between 10 and 30, preferably between 15 and 25 percent by weight, relative to the content of solids or non-volatile constituents.

The water-insoluble, alkali-soluble, film-forming phenolic resins which are contained in the mixture according to the invention and which are not sensitive to radiation, have a molecular weight from about 300 to 5,000 and they are prepared by a condensation reaction of phenol or substituted phenols with formaldehyde. Suitable substituted phenols are cresol, xylenol, butylphenol and the like. Phenol/formaldehyde novolaks, cresol/-formaldehyde novolaks and phenol-modified xylenol/-formaldehyde novolaks are particularly preferred alkali-soluble film-forming phenolic resins. The quantity of the phenolic resin is in the range of about 50 to 90% by weight, preferably 65 to 85% by weight, of the total non-volatile constituents.

The mixtures according to the invention also can contain, in known manner, fillers, dyes, pigments, photolytic acid-forming compounds, for example 1,2-naphthoquinone-(2)-4-sulfonic acid chloride, and other conventional additives and auxiliaries.

The supports used for the copying layer can be those which are conventional in reprography, for example, plates or foils of metal, such as aluminum or zinc, with an appropriately pretreated surface, multi-metal plates, for example of chromium/brass, chromium/copper-/aluminum and chromium/copper/zinc, and also paper sheets, plastic sheets, fabrics which are suitable for screen printing or metallized plates of an insulating material. Aluminum sheets which have been appropriately pretreated to improve the adhesion of the copying layer and to improve the hydrophilic character of the surface of the support are preferred, for example Al sheets which have been mechanically or electrochemically roughened and, if appropriate, anodized or which have been chemically pretreated.

The coating of the support material is carried out in known manner, for example by application by means of rollers or troughs, by spraying or by pouring. A suitable range of the layer weight, on a dry basis, is between 1.0 and 3.0 g/m$^2$. Although lower quantities of coating favor the photographic sensitivity, they have the disadvantage of a reduced film strength and of a reduced number of print runs.

After exposure, the light-sensitive copying materials are developed in the conventional manner with aqueous-alkaline solutions which also can contain minor amounts of organic solvents or wetting agents. Development can be effected by immersion, brushing or spraying in suitable processing devices or manually by wiping or dabbing with a swab.

The invention achieves a marked increase in the light-sensitivity compared with the known positive-working copying layers, without, in a remarkable manner, having to accept disadvantages in copying and printing technology at the same time, i.e., a deterioration in the resistance of the copying layer to developer, in the gradation, the image contrast or the number of print runs.

The invention is explained in detail by reference to the examples which follow.

EXAMPLE 1

0.73 part by weight of the esterification product obtained from one mole of 2,3,4-trihydroxy-benzophenone and 3 moles of naphthoquinone-(1,2)-diazide-(2)-5-sulfonic acid chloride, 0.55 part by weight of the esterification product obtained from one mole of 2,2'-dihydroxy-dinaphthyl-(1,1')-methane and 2 moles of naphthoquinone-(1,2)-diazide-(2)-5-sulfonic acid chloride, 5.33 parts by weight of a cresol-formaldehyde novolak having a softening point of 105°–120° C. determined by the DIN 53,181 capillary method, 0.17 part by weight of naphthoquinone-(1,2)-diazide-(2)-4-sulfonic acid chloride, 0.06 part by weight of Crystal Violet (C.I. 42,555) and 0.68 part by weight of the condensation product, described below, obtained from 2,3,4-trihydroxy-benzophenone and formaldehyde are dissolved in a solvent mixture composed of 40 parts by weight of ethylene glycol monomethyl ether, 50 parts by weight of tetrahydrofuran and 10 parts by weight of butyl acetate.

An electrochemically roughened and anodized aluminum foil is coated with this solution. The layer weight of dry substance here is 2.3 g/m$^2$.

To prepare a printing form, the printing plate thus obtained is exposed under a diapositive and is developed in known manner with the following solution:

5.3 parts by weight of sodium metasilicate·9 H$_2$O, 3.4 parts by weight of trisodium orthophosphate·12 H$_2$O, 0.3 part by weight of sodium dihydrogen phosphate (anhydrous) and 91 parts by weight of water, the exposed layer areas being removed. On an offset machine, about 150,000 perfect prints can be produced from the printing form prepared in this way.

The light-sensitive lithographic printing plate, prepared as described above, was exposed for 25 seconds under an exposure test wedge with the aid of a metal halide lamp of 5,000 watts at a lamp distance of 103 cm. The optimum exposure time was determined as that

LIGHT-SENSITIVE MIXTURE AND COPYING MATERIAL PRODUCED THEREFROM

This invention relates to a positive-working light-sensitive mixture which is suitable for the manufacture of lithographic printing plates, copying lacquers and the like.

Light-sensitive mixtures or copying materials of this generic type, the imagewise exposed areas of which become soluble in a developer solution in which the unexposed areas are insoluble, have been known for a long time. In practice, layers with o-quinone diazides are used, above all, as light-sensitive compounds for the manufacture of materials of this type, the layers also containing resins with groups conferring solubility in alkali, for example phenolic resins.

Copying layers of this type, however, have a relatively poor light-sensitivity. In the past, various proposals therefore already have been made for improving the photographic sensitivity of radiation-sensitive copying materials of this type, composed of an o-naphthoquinone diazide compound and an alkali-soluble, film-forming phenolic resin. Such attempts, however, hitherto have not led to significant success. Thus, although a reduction of the quantitative proportion of o-naphthoquinone diazide compound in the copying layer significantly increases the light-sensitivity, such a change results in a decreased resistance of the copying layer to developer.

The sensitivity of o-naphthoquinone diazide layers to electron radiation, can, as described in U.S. Pat. No. 3,661,582, be increased by adding certain N-heterocyclic compounds, such as 2-azacyclononan-2-one, indole, quinazoline and tetrazole. These systems also have only an extremely narrow latitude in development, similar to the case described above.

In Japanese Patent Application No. 42,449/1971, various additives, for example triphenylmethane dyes, benzaldehyde-m-tolylhydrazone, halogenated hydrocarbons and azo dyes, are described, in order to increase the photographic sensitivity; however, none of these compounds has a significant activity.

Finally, German Offenlegungsschrift No. 2,657,922, describes the addition of cyclic acid anhydrides for the same purpose. In this case also a marked increase in the sensitivity is obtained only at the expense of the resistance to developer.

It is therefore the object of the present invention to improve the light-sensitivity of the light-sensitive mixture which contains an o-naphthoquinone diazide compound and an alkali-soluble phenolic resin, without other essential properties thus being adversely affected.

The invention starts with a light-sensitive mixture which contains (a) an ester or amide of a 1,2-naphthoquinone diazide sulfonic or carboxylic acid as the light-sensitive compound, (b) a phenolic resin which is insoluble in water and soluble in aqueous-alkaline solutions, and (c) an aromatic keto compound having at least one phenolic hydroxy group.

The mixture according to the invention comprises an aromatic keto compound which is a condensation product of a hydroxybenzophenone and formaldehyde.

In German Offenlegungsschrift No. 2,547,905, light-sensitive copying materials of the type indicated here are described, which inter alia contain polyhydroxybenzophenones. These compounds are not condensed with formaldehyde; they are added in order to improve the adhesion of the layer to the support. In this connection, there is no mention of an increase in the light-sensitivity.

The aromatic keto compounds contained in the mixtures according to the invention and in the copying layers formed therefrom, are polycondensation products of hydroxybenzophenones and formaldehyde, wherein the benzophenone units are linked to one another via methylene bridges. At least one OH group here should be adjacent to the C atom which carries the carbonyl group. The preferred condensation products can be represented by the general formula I

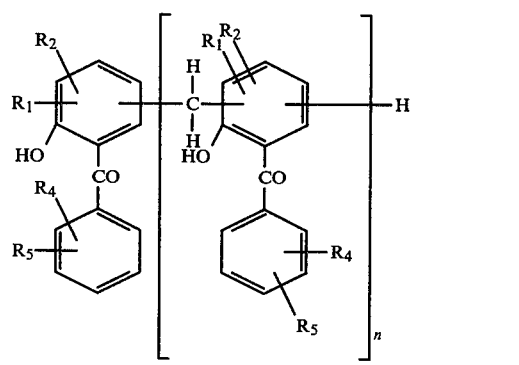

in which $R_1$, $R_2$, $R_4$ and $R_5$ denote hydrogen atoms or OH groups and n denotes a number from 1 to 10.

As is clear from the preparation, the benzophenone units also can be linked to one another via two methylene bridges, if appropriate.

Hydroxybenzophenones which are suitable for the reaction with formaldehyde are those which have at least one free o-position or p-position in a phenolic nucleus. Examples of hydroxybenzophenones which, after they have been condensed with formaldehyde, are particularly suitable as an additive for the mixture according to the invention, are:

2,3,4-trihydroxy-benzophenone,
2,4-dihydroxy-benzophenone,
2,4,6-trihydroxy-benzophenone,
2,3,4,4'-tetrahydroxy-benzophenone,
2,2',4,4'-tetrahydroxy-benzophenone, and
2,4,4'-trihydroxy-benzophenone.

Hydroxybenzophenones having at least two OH groups in the molecule are, in general, preferred.

The above-mentioned hydroxybenzophenones are reacted with aqueous formaldehyde solution (38% by weight), in general in a quantity from 1 to 1.5 mole per mole of phenolic compound, advantageously in the presence of an acid catalyst. The compounds are condensed with one another either without other additives or in organic solvents. Suitable organic solvents for the polycondensation reaction are, for example, methyl ethyl ketone, tetrahydrofuran and, in particular, 1,4-dioxane.

Suitable acid catalysts are, for example, hydrochloric acid, oxalic acid or p-toluenesulfonic acid.

For the polycondensation, the reaction mixture is heated for a certain length of time, for example one hour, to 70°–100° C. In general, the condensation product precipitates from the reaction solution; otherwise, the relatively mobile mixture is slowly poured into an value at which step 10 of the half-tone step wedge used here is fully covered on the plate. The density values of the exposure test wedge used are graded successively by 0.15 in each case. The highest density is 1.95 at step 13.

If an identical printing form, but without the addition of the condensation product obtained from 2,3,4-trihydroxy-benzophenone and formaldehyde, is prepared in the same layer thickness and on the same support and under otherwise the same experimental conditions, the exposure time, at which step 10 of the exposure wedge used is fully covered on the developed printing form, is 44 seconds. Thus, it was possible to increase the light-sensitivity by 76 percent by the addition of the 2,3,4-trihydroxybenzophenone/formaldehyde condensation product to the copying layer.

It is a further substantial advantage of the invention that the addition does not adversely affect either the size of the print run or the behavior with respect to printing technology during running or, for example the water-carrying characteristics, or the remaining technological properties in copying, such as gradation, image contrast and, above all, the resistance of the printing stencil to alkaline developer.

The preparation of the hydroxybenzophenone/formaldehyde condensation products is carried out analogously to the preparation of the phenol/formaldehyde novolaks. The low-molecular weight reaction product of 2,3,4-trihydroxy-benzophenone and formaldehyde, as employed in Example 1, is obtained relatively easily by heating a solution of 2,3,4-trihydroxy-benzophenone in excess formaldehyde solution (38% by weight) to 80°–100° C. in the presence of 1 N hydrochloric acid. The condensation product which is composed of two hydroxybenzophenone groups linked to one another via a methylene bridge precipitates in the pure form from the reaction solution after a relatively short time. Recrystallized from methanol, this condensation product melts at 233° C.

In the Examples which follow, the results obtained are similar to those in Example 1 with respect to an increase in the light-sensitivity. The shorter exposure times which have been found are indicated in each case in comparison with the corresponding copying layers without an addition of hydroxybenzophenone/formaldehyde condensation products.

All the comparative investigations were in each case carried out under the same experimental conditions as in Example 1. Of course, the absolute exposure times can vary depending on the type of lamp and the distance of the lamp. Again, corresponding to Example 1, no disadvantages of the printing plate in printing technology and copying technology are found in the examples which follow, despite shorter exposure times. Runs of at least 100,000 prints can be produced from the products of all the examples.

EXAMPLE 2

0.880 part by weight of the 4-(α,α-dimethyl-benzyl)-phenyl ester of naphthoquinone-(1,2)-diazide-(2)-4-sulfonic acid,
0.437 part by weight of the esterification product obtained from one mole of 2,2'-dihydroxy-dinaphthyl-(1,1')-methane and 2 moles of naphthoquinone-(1,2)-diazide-(2)-5-sulfonic acid chloride,
5.300 parts by weight of the novolak indicated in Example 1,
0.200 part by weight of naphthoquinone-(1,2-)-diazide-(2)-4-sulfonic acid chloride,
0.640 part by weight of the polycondensation product obtained from 2,3,4,4'-tetrahydroxy-benzophenone and formaldehyde, and
0.062 part by weight of Crystal Violet
are dissolved in a solvent mixture composed of
40 parts by weight of ethylene glycol monomethyl ether
40 parts by weight of tetrahydrofuran and
8 parts by weight of butyl acetate.

An electrochemically roughened and anodized aluminum foil is coated with this solution.
Exposure time: 29 seconds.
Without the addition of the hydroxybenzophenone/formaldehyde condensation product, the resulting exposure time is 44 seconds.
The condensation product from 2,3,4,4'-tetrahydroxybenzophenone and formaldehyde is prepared analogously to the description in Example 1 by reacting the phenol component with excess formaldehyde. The reaction product is a resinous mixture of homologs having different degrees of condensation.

EXAMPLE 3

1.40 parts by weight of the esterification product obtained from one mole of 2,4-dihydroxy-3,5-dibromobenzophenone and 2 moles of naphthoquinone-(1,2)-diazide-(2)-5-sulfonic acid chloride,
5.32 parts by weight of the novolak indicated in Example 1,
0.06 part by weight of Crystal Violet,
0.18 part by weight of naphthoquinone-(1,2)-diazide-(2)-4-sulfonic acid chloride and
0.56 part by weight of the polycondensation product obtained from 2,4,4'-trihydroxy-benzophenone and formaldehyde
are dissolved in a solvent mixture composed of
40 parts by weight of ethylene glycol monomethyl ether,
50 parts by weight of tetrahydrofuran and
8 parts by weight of butyl acetate.

An electrochemically roughened and anodized aluminum sheet is coated with this solution.
Exposure time: 24 seconds.
Without the addition of the benzophenone/formaldehyde condensation product, the resulting exposure time is 35 seconds.

EXAMPLE 4

1.26 parts by weight of the esterification product obtained from one mole of 2,3,4-trihydroxy-benzophenone and 2 moles of naphthoquinone-(1,2)-diazide-(2)-5-sulfonic acid chloride,
0.700 part by weight of the esterification product obtained from 2,2'-dihydroxy-dinaphthyl-(1,1')-methane and 2 moles of naphthoquinone-(1,2)-diazide-(2)-5-sulfonic acid chloride,
4.905 parts by weight of the novolak indicated in Example 1,
0.055 part by weight of Sudan Yellow GGN (C.I. 11,021) and
0.600 part by weight of the polycondensation product obtained from 2,4-dihydroxy-benzophenone and formaldehyde
are dissolved in a solvent mixture composed of
40 parts by weight of ethylene glycol monomethyl ether, 50 parts by weight of tetrahydrofuran and
8 parts by weight of butyl acetate.

An electrochemically roughened and anodized aluminum foil is coated with this solution.

Exposure time: 21 seconds.

Without the addition of the dihydroxy-benzophenone/formaldehyde condensation product, the resulting exposure time is 35 seconds.

EXAMPLE 5

0.760 part by weight of the esterification product obtained from one mole of 2,3,4-trihydroxy-benzophenone and 3 moles of naphthoquinone-(1,2)-diazide-(2)-5-sulfonic acid chloride, 0.640 part by weight of the esterification product obtained from 2,2'-dihydroxy-dinaphthyl-(1,1')-methane and 2 moles of naphthoquinone-(1,2)-diazide-(2)-5-sulfonic acid chloride, 4.750 parts by weight of a phenol/formaldehyde novolak having a softening point of 112°–118° C. (the content of phenolic groups is 14 percent by weight), 0.155 part by weight of a polyvinyl butyral, 0.070 part by weight of Sudan Yellow GGN (C.I. 11,021), 0.136 part by weight of Crystal Violet base, 0.550 part by weight of phosphoric acid tris-(2-chloroethyl)ester and 0.690 part by weight of the condensation product obtained from 2,3,4-trihydroxy-benzophenone and formaldehyde are dissolved in a solvent mixture composed of 40 parts by weight of ethylene glycol monomethyl ether, 50 parts by weight of tetrahydrofuran and 10 parts by weight of butyl acetate.

An electrochemically roughened and anodized aluminum sheet is coated with this solution.

Exposure time: 23 seconds.

Without the addition of the trihydroxy-benzophenone/formaldehyde condensation product, the resulting exposure time is 35 seconds.

EXAMPLE 6

0.893 part by weight of the esterification product obtained from one mole of 2,4-dihydroxy-benzophenone and 2 moles of naphthoquinone-(1,2)-diazide-(2)-5-sulfonic acid chloride, 0.446 part by weight of the esterification product obtained from 1 mole of 2,2'-dihydroxy-dinaphthyl-(1,1')-methane and 2 moles of naphthoquinone-(1,2)-diazide-(2)-5-sulfonic acid chloride, 5.320 parts by weight of the novolak indicated in Example 1, 0.061 part by weight of Crystal Violet, 0.199 part by weight of naphthoquinone-(1,2)-diazide-(2)-4-sulfonic acid chloride and 0.600 part by weight of the polycondensation product obtained from 2,4,6-trihydroxy-benzophenone and formaldehyde are dissolved in a solvent mixture composed of 40 parts by weight of ethylene glycol monomethyl ether, 50 parts by weight of tetrahydrofuran and 10 parts by weight of butyl acetate.

An electrochemically roughened and anodized aluminum sheet is coated with this solution.

Exposure time: 27 seconds.

Without the addition of the trihydroxy-benzophenone/formaldehyde condensation product, the resulting exposure time is 35 seconds.

EXAMPLE 7

0.871 part by weight of the esterification product obtained from one mole of 2,3,4-trihydroxy-benzophenone and 2 moles of naphthoquinone-(1,2)-diazide-(2)-5-sulfonic acid chloride, 0.49 part by weight of the esterification product obtained from 2,2'-dihydroxy-dinaphthyl-(1,1')-methane and 2 moles of naphthoquinone-(1,2)-diazide-(2)-5-sulfonic acid chloride, 5.44 parts by weight of the novolak indicated in Example 1, 0.046 part by weight of Sudan Yellow GGN (C.I. 11,021), 0.073 part by weight of Crystal Violet and 0.600 part by weight of the condensation product obtained from 2,3,4-trihydroxy-benzophenone and formaldehyde are dissolved in a solvent mixture composed of 35 parts by weight of ethylene glycol monomethyl ether, 45 parts by weight of tetrahydrofuran and 8 parts by weight of butyl acetate.

An aluminum foil, mechanically roughened with the aid of wire brushes, is coated with this solution.

Exposure time: 20 seconds.

Without the addition of the trihydroxy-benzophenone/formaldehyde condensation product, the resulting exposure time is 37 seconds.

It will be obvious to those skilled in the art that many modifications may be made within the scope of the present invention without departing from the spirit thereof, and the invention includes all such modifications.

What is claimed is:

1. A light-sensitive mixture comprising
   (a) an ester or amide of a 1,2-naphthoquinone-diazide-sulfonic or -carboxylic acid as the light-sensitive compound,
   (b) a phenolic resin which is soluble in aqueous-alkaline solutions and insoluble in water, and
   (c) about 4 to 20 percent by weight, based on the total solids content of the mixture, of a polycondensation product of formaldehyde and a hydroxybenzophenone having at least one free o- or p-position in a phenolic nucleus and wherein at least one OH group is in a position adjacent to the carbon atom which carries the carbonyl group, the benzophenone units of said polycondensation product being linked to one another via methylene bridges.

2. A light-sensitive mixture as claimed in claim 1 wherein the condensation product corresponds to the general formula I

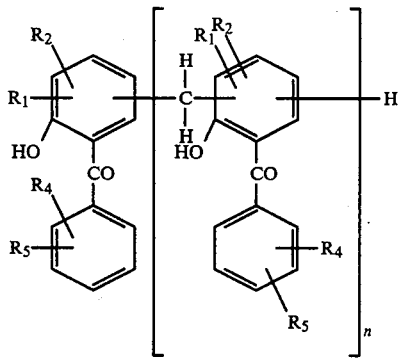

in which $R_1$, $R_2$, $R_4$ and $R_5$ denote hydrogen atoms or OH groups and n denotes a number from 1 to 10.

3. A light-sensitive mixture as claimed in claim 1 which contains the condensation product in a quantity from 3 to 20 percent by weight, relative to the weight of its non-volatile constituents.

4. A light-sensitive mixture as claimed in claim 1 wherein the hydroxybenzophenone contains at least two hydroxyl groups in the molecule.

5. A light-sensitive mixture as claimed in claim 4 wherein the hydroxybenzophenone is 2,3,4-trihydroxybenzophenone.

6. A light-sensitive copying material comprising a support and a light-sensitive layer which contains
   (a) an ester or amide of a 1,2-naphthoquinone-diazide-sulfonic or -carboxylic acid as the light-sensitive compound,
   (b) a phenolic resin which is insoluble in water and soluble in aqueous-alkaline solutions and
   (c) about 4 to 20 percent by weight, based on the total solids content of the mixture, of a polycondensation product of formaldehyde and a hydroxybenzophenone having at least one free o- or p-position in a phenolic nucleus and wherein at least one OH group is in a position adjacent to the carbon atom which carries the carbonyl group, the benzophenone units of said polycondensation product being linked to one another via methylene bridges.

* * * * *